US009929252B2

(12) United States Patent
Choi et al.

(10) Patent No.: US 9,929,252 B2
(45) Date of Patent: Mar. 27, 2018

(54) METHOD OF FORMING THIN FILM AND METHOD OF MANUFACTURING SEMICONDUCTOR DEVICE

(71) Applicant: Samsung Electronics Co., Ltd., Suwon-si, Gyeonggi-do (KR)

(72) Inventors: Sun-gyu Choi, Namyangju-si (KR); Sang-jin Hyun, Suwon-si (KR); Taek-soo Jeon, Yongin-si (KR); Hoon-joo Na, Hwaseong-si (KR); Young-suk Chai, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/133,548

(22) Filed: Apr. 20, 2016

(65) Prior Publication Data

US 2016/0314963 A1 Oct. 27, 2016

(30) Foreign Application Priority Data

Apr. 23, 2015 (KR) ........................ 10-2015-0057538

(51) Int. Cl.
*H01L 29/66* (2006.01)
*H01L 21/324* (2006.01)
(Continued)

(52) U.S. Cl.
CPC .. *H01L 29/66795* (2013.01); *H01L 21/02236* (2013.01); *H01L 21/02249* (2013.01);
(Continued)

(58) Field of Classification Search
CPC ......... H01L 29/66795; H01L 21/02236; H01L 21/02249
See application file for complete search history.

(56) References Cited

U.S. PATENT DOCUMENTS 6,642,573 B1 * 11/2003 Halliyal ............ H01L 21/28185
257/316
6,838,396 B2 1/2005 Burnham et al.
(Continued)

FOREIGN PATENT DOCUMENTS

JP 2009-059964 A 3/2009
JP 2012-080094 A 4/2012
(Continued)

*Primary Examiner* — Errol Fernandes
(74) *Attorney, Agent, or Firm* — Harness, Dickey & Pierce, PLC

(57) ABSTRACT

A method of forming a thin film includes forming an interface layer stack on a semiconductor substrate. Forming the interface layer stack may include performing a first surface treatment on the semiconductor substrate under a reducing atmosphere. Forming the interface layer stack may include performing a second surface treatment on the semiconductor substrate. The first surface treatment may be performed under a reducing atmosphere and the second surface treatment may be performed under a nitridation atmosphere. The first surface treatment may include forming a lower interface layer on a surface of the semiconductor substrate and the second surface treatment may include forming an upper interface layer. The first surface treatment may include selectively removing at least one oxide material from a native oxide film on the semiconductor substrate.

14 Claims, 14 Drawing Sheets

(51) Int. Cl.
*H01L 21/02* (2006.01)
*C23C 16/02* (2006.01)
*C23C 16/40* (2006.01)

(52) U.S. Cl.
CPC .. *H01L 21/02255* (2013.01); *H01L 21/02312* (2013.01); *H01L 21/324* (2013.01); *C23C 16/0218* (2013.01); *C23C 16/405* (2013.01)

(56) References Cited

U.S. PATENT DOCUMENTS

| | | |
|---|---|---|
| 7,368,045 B2 | 5/2008 | Vereecken et al. |
| 7,824,990 B2 | 11/2010 | Chang et al. |
| 8,304,836 B2 | 11/2012 | Jagannathan et al. |
| 8,357,583 B2 | 1/2013 | Hirota et al. |
| 8,492,852 B2 | 7/2013 | Chen et al. |
| 8,508,020 B2 | 8/2013 | Hirota et al. |
| 8,680,511 B2 | 3/2014 | Dimitrakopoulos et al. |
| 8,691,636 B2 | 4/2014 | Liu et al. |
| 8,981,486 B2 | 3/2015 | Rouh et al. |
| 2006/0133146 A1* | 6/2006 | Maekawa .......... G11C 16/0416 365/185.14 |
| 2014/0001541 A1 | 1/2014 | Rouh et al. |
| 2014/0011339 A1 | 1/2014 | Zheng et al. |
| 2014/0109930 A1 | 4/2014 | Kaufman-Osborn et al. |
| 2015/0008504 A1* | 1/2015 | Chang ............... H01L 29/66833 257/324 |
| 2015/0155207 A1 | 6/2015 | Rouh et al. |

FOREIGN PATENT DOCUMENTS

| | | |
|---|---|---|
| KR | 10-2014-0003864 | 1/2014 |
| KR | 10-2014-0087336 | 7/2014 |

\* cited by examiner 7B-7B'

METHOD OF FORMING THIN FILM AND METHOD OF MANUFACTURING SEMICONDUCTOR DEVICE

CROSS-REFERENCE TO RELATED APPLICATION

This application claims the benefit of Korean Patent Application No. 10-2015-0057538, filed on Apr. 23, 2015, in the Korean Intellectual Property Office, the disclosure of which is incorporated herein in its entirety by reference.

BACKGROUND

Field

The inventive concepts relate in general to thin films, and more particularly forming a thin film or manufacturing semiconductor devices.

Description of Related Art

In order to overcome a scaling limit of an existing silicon-based device, techniques for combining materials having high mobility characteristics have been considered, and research into a silicon germanium (SiGe) channel material has been conducted. However, there is a need to further improve characteristics and enhance the quality of an interface layer.

SUMMARY

Some embodiments of the inventive concepts include a method of forming a thin film that secures high carrier mobility and includes a low leakage current, and excellent in electrical characteristics.

Some embodiments of the inventive concepts include a method of manufacturing a semiconductor device having a high operating speed, a low leakage current, and excellent electrical characteristics.

Some embodiments of the inventive concepts include a semiconductor device having a high operating speed, a low leakage current, and excellent electrical characteristics.

According to some embodiments of the inventive concepts, there is provided a method of forming a thin film, the method including: preparing a semiconductor substrate; forming an interface layer stack on a surface of the semiconductor substrate, and forming an insulating layer on the interface layer stack. The interface layer stack may include a first interface layer and a second interface layer. Forming the interface layer stack may include performing a first surface treatment on the semiconductor substrate in a reducing atmosphere to form the first interface layer, and performing a second surface treatment on the semiconductor substrate in a nitridation atmosphere to form the second interface layer.

The reducing atmosphere may include a hydrogen ($H_2$) atmosphere. The first surface treatment may include annealing the semiconductor substrate at a temperature of about 500° C. to about 800° C.

The semiconductor substrate may include a silicon germanium (SiGe) substrate, and prior to the first surface treatment, a native oxide film may be formed on a surface of the semiconductor substrate. The first surface treatment may include selectively reducing at least a portion of germanium (Ge) oxide in the semiconductor substrate. The first surface treatment may include performing the first surface treatment such that an amount of germanium (Ge) oxide in the semiconductor substrate being reduced, relative to an amount of germanium (Ge) oxide in the native oxide film.

The performing the first surface treatment may include performing the first surface treatment independently of either a silicon compound or a silicon precursor being supplied to the semiconductor substrate.

The first surface treatment may include substantially forming a silicon (Si) oxide film on a surface of the semiconductor substrate. The second surface treatment may include forming a silicon oxynitride (SiON) film on the silicon oxide film. The nitridation atmosphere may include one of a nitrogen ($N_2$) atmosphere, an ammonia ($NH_3$) atmosphere, a hydrazine ($N_2H_4$) atmosphere, a methylhydrazine ($MeN_2H_3$) atmosphere, a monomethylamine ($MeNH_2$) atmosphere, a dimethylamine ($Me_2NH$) atmosphere, or a trimethylatnine ($Me_3N$) atmosphere. A ratio of the silicon oxide film to the silicon oxynitride film may be in the range of about 1:3 to about 1:10. The interface layer may include both the silicon oxide film and the silicon oxynitride film.

The interface layer may have a thickness of about 5 Å to about 30 Å.

According to some embodiments of the inventive concepts, there is provided a method of manufacturing a semiconductor device, the method including: preparing a semiconductor substrate; forming an interface layer stack on the semiconductor substrate, forming a gate dielectric film on the interface layer, and forming a gate electrode on the gate dielectric film. Forming the interface layer stack may include performing a first surface treatment on the semiconductor substrate under a reducing atmosphere; after the first surface treatment, performing a second surface treatment on the semiconductor substrate under a nitridation atmosphere.

A portion of the semiconductor substrate which was subjected to the first surface treatment may include a channel region. A dielectric constant of the gate dielectric film may be greater than a dielectric constant of the interface layer.

The semiconductor substrate may include at least one material selected from a group including a group III-V material and a group IV material. Prior to the first surface treatment, a native oxide film including at least two elements may be formed on a surface of the semiconductor substrate, and the first surface treatment may include selectively reducing an oxide of the element having a relatively larger atomic radius among the two elements. Through the first surface treatment, an amount of the oxide of the element having the relatively larger atomic radius may be reduced more than that in the native oxide film.

A lower interface layer may be formed through the first surface treatment, and an upper interface layer may be formed through the second surface treatment. A thickness of the upper interface layer may be about 3 times to about 10 times of a thickness of the lower interface layer. The upper interface layer may be a silicon oxynitride film, and as it gets farther from the lower interface layer in the upper interface layer, a ratio of nitrogen to oxygen may gradually increase.

The second surface treatment may include secondary annealing performed at a temperature of about 500° C. to about 800° C.

According to some embodiments of the inventive concepts, there is provided a semiconductor device including: a silicon germanium channel region disposed between a source region and a drain region; an interface layer stack disposed on the channel region; a gate dielectric film disposed on the interface layer; and a gate electrode disposed on the gate dielectric film. The interface layer stack includes a lower interface layer and an upper interface layer, the lower interface layer contacting the silicon germanium channel region and the upper interface layer being interposed between the lower interface layer and the gate dielectric film.

The lower interface layer may be a silicon oxide film, and the upper interface layer may be a silicon oxynitride film. The gate dielectric film may extend from a lower surface of the gate electrode to sidewalls of the gate electrode. The interface layer may not extend along the sidewalk of the gate electrode. The interface layer may be disposed only between the gate electrode and the silicon germanium channel region.

The interface layer may directly contact the silicon germanium channel region.

The semiconductor device may be any one of a planar field effect transistor (FET), FinFET, a (gate-all-around (GAA) FET, and a vertical FET.

According some embodiments of the inventive concepts, there is provided an electronic system including: a controller; an input/output unit configured to input or output data; a memory configured to store data; an interface configured to transmit data to an external device; and a bus configured to connect the controller, the input/output unit, and a memory, wherein the controller, the input/output unit, and the memory communicate with one another via the bus, and at least one of the controller and the memory comprises the semiconductor device.

According to some embodiments of the inventive concepts, there is provided a method including forming an interface layer stack on a semiconductor substrate. The forming may include performing a first surface treatment on the semiconductor substrate such that at least one oxide material is selectively removed from a native oxide film formed on the semiconductor substrate, and at least one separate oxide material included in the native oxide film is restricted from being removed.

BRIEF DESCRIPTION OF THE DRAWINGS

Example embodiments will be described in more detail with regard to the figures, wherein like reference numerals refer to like parts throughout the various figures unless otherwise specified, and wherein.

Figure 1:
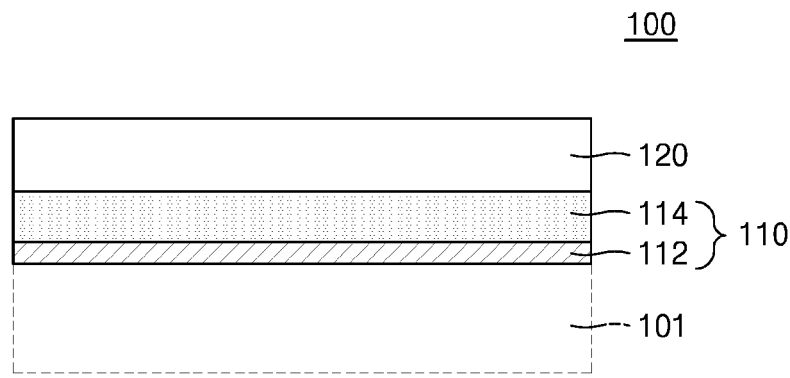
FIG. 1 is a cross-sectional view of a thin film according to some embodiments of the inventive concepts.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION OF THE EMBODIMENTS

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s)

as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

When a certain exemplary embodiment is differently implementable, a specific process procedure may be performed in a different order relative to an order described herein. For example, two successively-described processes may be performed at substantially the same time, or may be performed in reverse order. In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes. The term "substrate" used herein may mean a substrate itself or a stack structure including a substrate and a desired (or alternatively, predetermined) layer or film formed thereon. Also, the expression "surface of a substrate" may mean an exposed surface of a substrate or an external surface of a desired (or alternatively, predetermined) layer or film formed thereon.

FIG. 1 is a cross-sectional view of a thin film 100 according to some embodiments of the inventive concepts.

Referring to FIG. 1, the thin film 100 may include an interface layer stack 110 formed on a semiconductor substrate 101 and an insulating layer 120 formed on the interface layer stack 110. The interface layer stack 110 may include a lower interface layer 112 adjacent to the semiconductor substrate 101 and an upper interface layer 114 adjacent to the insulating layer 120.

In some embodiments, the semiconductor substrate 101 may include at least one material selected from a group which includes a group material and a group IV material. In some embodiments, the semiconductor substrate 101 may include at least one material selected from a group including a group III-V material and a group IV material. The group III-V material may include one or more of a binary compound, a ternary compound, or a quaternary compound, which includes at least one group III element and at least one group V element. The group III-V material may include a compound that includes at least one material selected from a group including indium (In), gallium (Ga), and aluminium (Al) in group III and at least one material selected from a group including arsenide (As), phosphorous (P), and antimony (Sb) in group V. For example, the group III-V material may include at least one material selected from a group including InP, $In_zGa_{1-z}As$ ($0 \le z \le 1$), and $Al_zGa_{1-z}As$ ($0 \le z \le 1$). The binary compound may include, for example, at least one material selected from the group including indium phosphide (InP), gallium arsenide (GaAs), indium arsenide (InAs), indium antimonide (InSb), and gallium antimonide (GaSb). The ternary compound may include at least one material selected from a group including indium gallium phosphide (InGaP), indium gallium arsenide (InGaAs), aluminium indium arsenide (AlInAs), indium gallium antimonide (InGaSb), gallium arsenide antimonide (GaAsSb), and gallium arsenide phosphide (GaAsP). The group IV material may include one or more of silicon (Si) or germanium (Ge). However, the group III-V material and the group IV material used for forming the thin film 100 according to some embodiments of the inventive concepts are not limited the materials described above.

In some embodiments, one or more of the group III-V material and the group IV material, including Ge, may be used as a channel material of a low-power, high-speed transistor. A high performance CMOS may be formed by using a semiconductor substrate including a group material which includes high electron mobility compared to a Si substrate. For example, a CMOS may be formed by using a semiconductor substrate which includes GaAs. In some embodiments, a high performance CMOS may be formed by using a semiconductor substrate including a semiconductor material having higher hole mobility compared to a Si substrate. For example, a CMOS may be formed by using a SiGe semiconductor substrate which includes Ge. In some embodiments, when an N-type channel is to be formed in the substrate 101, the substrate 101 may include one or more of SiC at least one material selected from a group including the III-V materials described above, some combination thereof, etc. in some embodiments, a P-type channel may be formed in a substrate 101, where the substrate 101 may include SiGe.

In some embodiments, the interface layer stack 110 may include one or more of the lower interface layer 112 and the upper interface layer 114.

The lower interface layer 112 may include an oxide of an element derived from the substrate 101. For example, when the semiconductor substrate 101 is a SiGe substrate, the oxide may be silicon oxide (SiOx) but is not limited thereto. In particular, germanium oxide (GeOx) may not substantially exist in the lower interface layer 112. The lower interface layer 112 may have a thickness of about 1 Å to about 5 Å.

The term "derived" means that the element (for example, Si) in the oxide (for example, SiOx) is not further added through a deposition process, but rather, the element (for example, Si) initially existing in the semiconductor substrate 101 may be oxidized by some cause to generate the oxide (for example, SiOx).

In some embodiments, a composition of the upper interface layer 114 is different from a composition of the lower interface layer 112. The upper interface layer 114 may include a nitride of an element derived from the substrate 101, an oxynitride of the element, some combination thereof, etc. For example, when the semiconductor substrate 101 includes a SiGe substrate, the oxynitride may include silicon oxynitride (SiON) but is not limited thereto. In particular, germanium oxide (GeO$_x$) may not substantially exist in the upper interface layer 114.

The term "derived" means that the element (for example, Si) in the oxynitride (for example, SiON) is not further added through a deposition process, but rather, any element (for example, Si) initially existing in the semiconductor substrate 101 may be nitridated or oxynitridated by some cause to generate the oxynitride (for example, SiON).

The upper interface layer 114 may be thicker than the lower interface layer 112. For example, a thickness of the upper interface layer 114 may be about 3 times to about 10 times of a thickness of the lower interface layer 112. For example, the upper interface layer 114 may have a thickness of about 3 Å to about 25 Å. The interface layer stack 110 may have a total thickness of about 5 Å to about 30 Å. However, the inventive concepts are not limited thereto.

The insulating layer 120 may be disposed on the upper interface layer 114. The insulating layer 120 may include a material having a dielectric constant greater than a dielectric constant of the interface layer stack 110. For example, the insulating layer 120 may include a material having a dielectric constant of about 10 to about 25. In some embodiments, the insulating layer 120 may include at least one material selected from a group including hafnium oxide, hafnium oxynitride, hafnium aluminium oxide, hafnium silicon oxide, hafnium zirconium oxide, hafnium titanium oxide, hafnium lanthanum oxide, lanthanum oxide, lanthanum aluminium oxide, zirconium oxide, zirconium silicon oxide, zirconium lanthanum oxide, zirconium aluminium oxide, zirconium titanium oxide, tantalum oxide, titanium oxide, barium strontium titanium oxide, titanium silicon oxide, barium titanium oxide, strontium titanium oxide, yttrium oxide, erbium oxide, dysprosium oxide, gadolinium oxide, aluminium oxide, lead scandium tantalum oxide, lead zinc niobate, and any combinations thereof. For example, the insulating layer 120 may include at least one material selected from a group including HfO$_2$, ZrO$_2$, HfSiO$_x$, TaSiO$_x$, and LaO$_x$. However, in the thin film 100 according to an exemplary embodiment of the inventive concept, a material of the insulating layer 120 is not limited to the selected material.

Applications of the thin film 100 will be described in more detail below.

Figure 2:
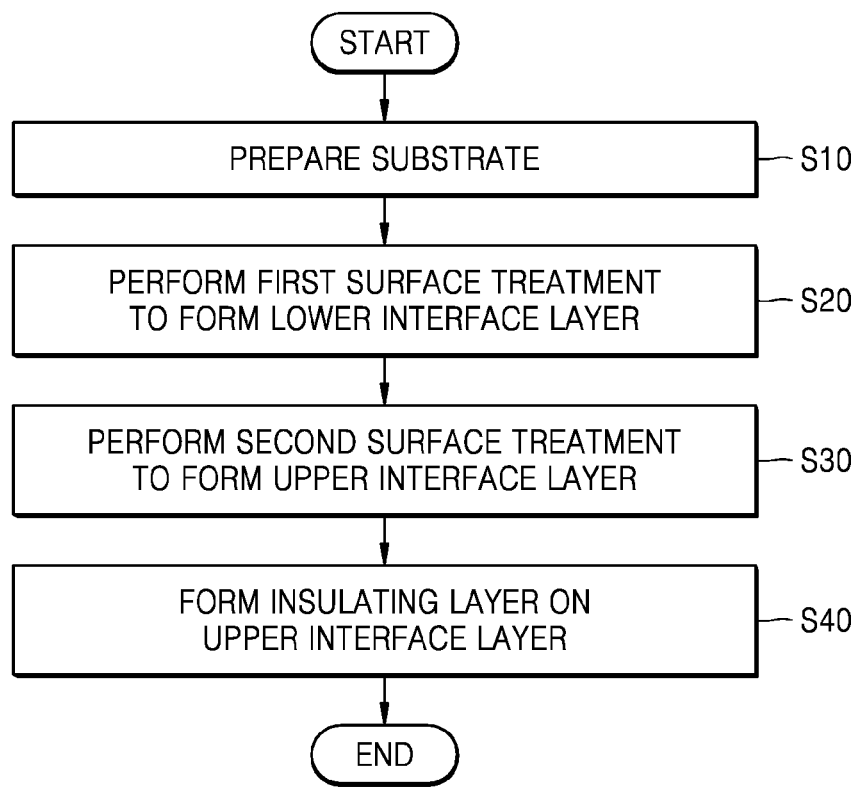
FIG. 2 is a flowchart of a method of manufacturing a thin film according to some embodiments of the inventive concepts.

FIG. 2 is a flowchart of a method of manufacturing a thin film 100, according to some embodiments of the inventive concepts. FIGS. 3A to 3D are cross-sectional views illustrating a method of manufacturing a thin film 100, according to some embodiments of the inventive concepts.

Figure 3A:
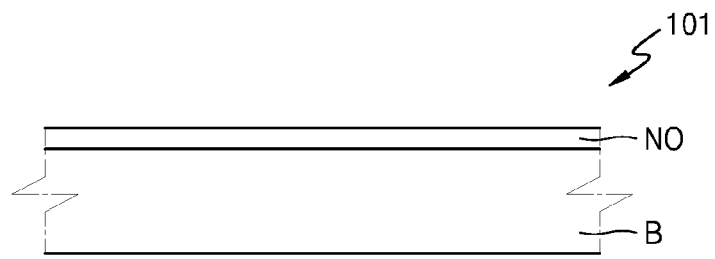
FIGS. 3A to 3D are cross-sectional views illustrating a method of manufacturing a thin film according to some embodiments of the inventive concepts.

Referring to FIGS. 2 and 3A, a semiconductor substrate 101 is prepared (S10). Since the semiconductor substrate 101 has been described in detail with reference to FIG. 1, additional descriptions thereof will be omitted herein.

As shown in FIG. 3A, the substrate 101 may include a bulk part B and a native oxide film NO formed on the bulk part B. In some embodiments, where the substrate 101 includes a SiGe substrate, the native oxide film NO may include both silicon oxide and germanium oxide. Specifically, the germanium oxide may include a stoichiometrically oxygen-poor portion formed in the native oxide film NO, and the oxygen-poor portion of the germanium oxide may cause a decrease in carrier mobility. In some embodiments, since a SiGe substrate is often used as a channel so as to increase the carrier mobility, the stoichiometrically oxygen-poor germanium oxide may be removed.

The native oxide film NO may be intentionally formed or may be unintentionally formed while handling the substrate 101. The native oxide film NO may have a thickness of several angstroms (Å) to several tens of nanometers (nm).

In some embodiments, the native oxide film NO is naturally formed, such that the native oxide film is not formed in the substrate 101 through a deposition process or the like. Therefore, a semiconductor element in the native oxide film NO may be a semiconductor element derived from the semiconductor substrate 101.

Hereinafter, an exemplary embodiment in which the semiconductor substrate 101 is a SiGe substrate will be described, but the inventive concepts are not limited thereto.

Figure 3B:
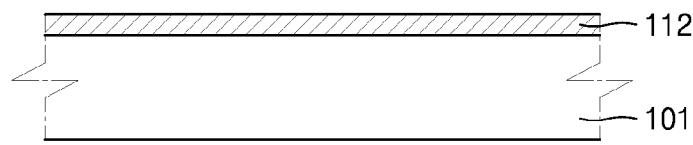

Referring to FIGS. 2 and 3B, a lower interface layer 112 may be formed by performing first surface treatment, also referred to herein as a primary surface treatment, on the semiconductor substrate 101 including the native oxide film NO (S20).

The first surface treatment may include, for example, one or more of annealing or a plasma treatment. In the first surface treatment, germanium oxide, which may cause defects, may be removed from the native oxide film NO.

As described above, the germanium oxide may exist together with silicon oxide, and as silicon oxide may not cause defects, the germanium oxide may be selectively removed, while the silicon oxide is restricted from being removed. In other words, the germanium oxide may be selectively removed from the native oxide film NO while the silicon oxide remains. Therefore, in operation S20, a silicon compound or a silicon precursor for depositing Si may be restricted from being supplied to the semiconductor substrate.

In some embodiments, when the first surface treatment is performed through annealing, an annealing temperature may be determined so as to apply enough energy to break a bond between germanium and oxygen. Since an atomic radius of germanium is greater than an atomic radius of silicon, the binding energy between germanium and oxygen is weaker than the binding energy between silicon and oxygen. Therefore, in some embodiments the annealing is performed at a particular temperature. The particular temperature may be sufficiently great to break bonds between germanium and oxygen while insufficiently great to break bonds between silicon and oxygen. Annealing for the first surface treatment may be performed at a particular temperature of about 500° C. to 800° C. for several to tens of seconds.

In particular, the first surface treatment may be performed under a reducing atmosphere, in a presence of a reducing gas, etc. For example, the first surface treatment may be performed while supplying a reducing gas such as hydrogen ($H_2$). A volumetric flow rate of the reducing gas may be varied according to a gas type and a reaction chamber size, and for example, may be several ten to several hundred standard cubic centimeters per minute ("SCCM"), but is not limited thereto.

When the first surface treatment is performed under a reducing atmosphere, pressure in the reaction chamber may be in the range of several Torr to about 1 atm.

The amount of germanium oxide in the semiconductor substrate may decrease to be less than the amount of germanium oxide in the native oxide film NO through the first surface treatment.

Figure 3C:
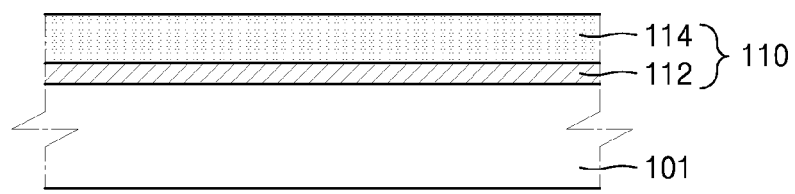

Referring to FIGS. 2 and 3C, an upper interface layer 114 may be formed on the lower interface layer 112 by performing a second surface treatment (S30), also referred to herein as a secondary surface treatment.

The upper interface layer 114 formed though the second surface treatment may be used to adjust dielectric characteristics of the finally formed interface layer stack 110. For example, the upper interface layer 114 may be annealed or plasma-treated.

The second surface treatment may be performed under a nitridation atmosphere, in a presence of a nitrogen-containing gas, etc. For example, the second surface treatment may be performed under a nitrogen ($N_2$) atmosphere, ammonia ($NH_3$) atmosphere, hydrazine ($N_2H_4$), methylhydrazine ($MeN_2H_3$) atmosphere, monomethylamine ($MeNH_2$) atmosphere, dimethylamine ($Me_2NH$) atmosphere, or trimethylamine ($Me_3N$) atmosphere. A nitrogen-containing gas supplied for establishing the nitridation atmosphere may include $N_2$, $NH_3$, $N_2H_4$, $MeN_2H_3$, $MeNH_2$, $Me_2NH$, or $Me_3N$. A volume flow rate of the nitrogen-containing gas may be varied according to a gas type and a reaction chamber size, and for example, may be several ten to several hundred SCCM, but is not limited thereto.

The upper interface layer 114 may be formed on the lower interface layer 112 through the second surface treatment. The upper interface layer 114 may include, for example, a silicon oxynitride (SiON) film.

In some embodiments, when the second surface treatment is performed through annealing, the second surface treatment may be performed at a temperature of about 500° C. to about 800° C. for several seconds to tens of seconds. In addition, when the second surface treatment is performed under a nitridation atmosphere, a pressure of the second surface treatment may be in the range of several Torr to about 1 atm.

The silicon of the SiON film, that is, the upper interface layer 114, may be derived from the semiconductor substrate 101. Therefore, in operation S30, a silicon compound or a silicon precursor for depositing Si may not be supplied from the outside.

In some embodiments, a nitrogen concentration in the SiON film of the upper interface layer 114 may be non-uniform. The nitrogen concentration of the SiON film may vary in direct proportion, inverse proportion, etc. with a distance through the thickness of the film from an upper surface of the upper interface layer 114, a lower surface of the upper interface layer 114, some combination thereof, etc. The nitrogen concentration of the SiON film may gradually decrease from an upper surface of the upper interface layer 114 toward the lower interface layer 112. In other words, as distance through the upper interface layer from the lower interface layer 112 increases, a molar ratio of nitrogen to oxygen in the SiON film may increase.

Figure 3D:
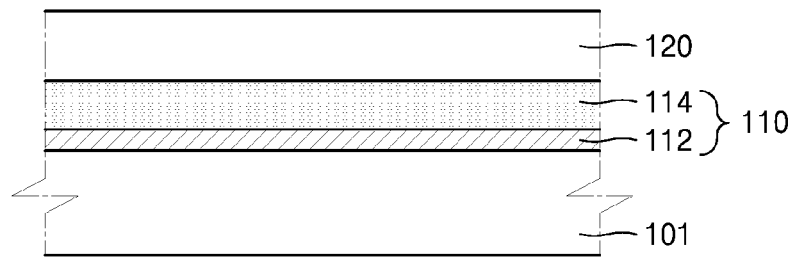

Referring to FIGS. 2 and 3D, an insulating layer 120 may be formed on the upper interface layer 114. Since a material of the insulating layer 120 has been described with reference to FIG. 1, additional descriptions thereof will be omitted herein.

The insulating layer 120 may be formed by an atomic layer deposition (ALD) process, a chemical vapor deposition (CVD) process, or a physical vapor deposition (PVD) process. However, the inventive concepts are not limited thereto. The insulating layer 120 may be formed so as to have a thickness of about 5 Å to about 30 Å, but is not limited thereto.

The thin film 100 including the interface layer stack 110 and the insulating layer 120 may be formed on the semiconductor substrate 101 as described above.

Carrier mobility in the thin film 100 may be considerably increased by eliminating or considerably reducing the amount of stoichiometrically oxygen-poor germanium oxide (GeOx) existing in the lower interface layer 112, and an equivalent oxide thickness (EOT) scaling effect may be obtained by adding the upper interface layer 114 having an appropriate thickness.

Hereinafter, the composition and effect of the inventive concepts will be more fully described according to Examples and Comparative Examples, but it should be noted that Examples and Comparative Examples are merely provided to more clearly understand the inventive concept, not to limit the scope of the inventive concept.

Example 1

Annealing was performed on a SiGe substrate, the substrate including a native oxide film, as a first surface treatment under a hydrogen atmosphere, and annealing was performed on the SiGe substrate as second surface treatment under an ammonia ($NH_3$) atmosphere. Annealing temperatures were about 550° C. and about 650° C., respectively.

Comparative Example 1

Annealing was performed on a SiGe substrate, the substrate including a native oxide film, as a first surface treatment under a hydrogen atmosphere. An annealing temperature was about 550° C.

Comparative Example 2

Annealing was performed on a SiGe substrate including a native oxide film as a second surface treatment under an $NH_3$ atmosphere. An annealing temperature was about 650° C.

Figure 4A:
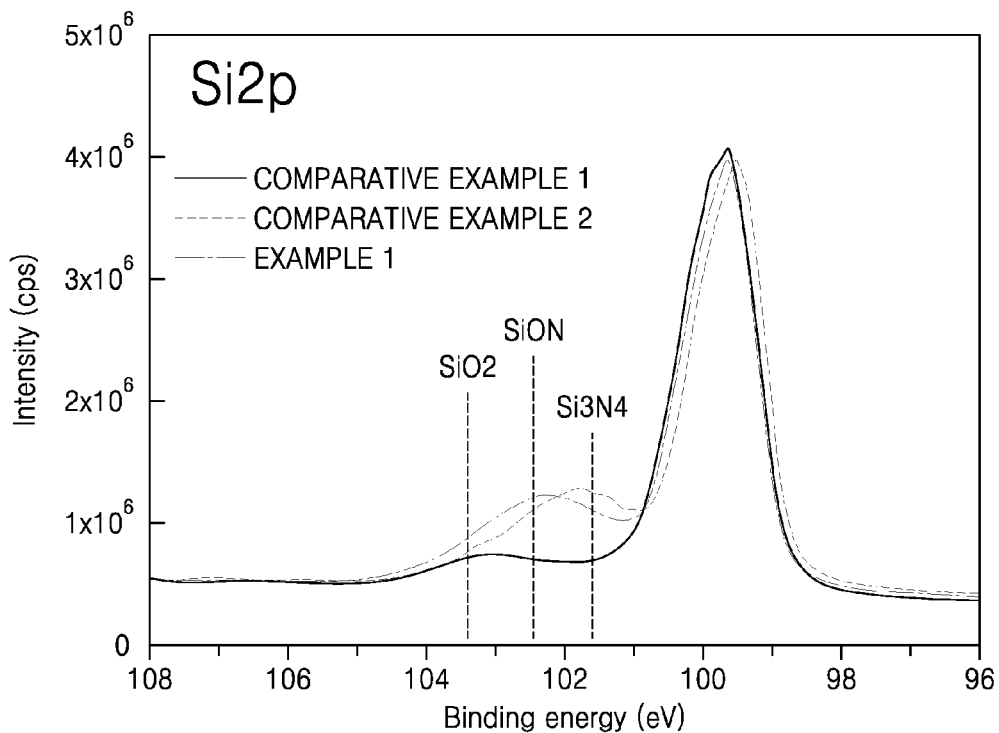
FIGS. 4A and 4B are graphs showing results of X-ray photoelectron spectroscopy (XPS) analyses with respect to thin films, according to some embodiments of the inventive concepts.
Figure 4B:
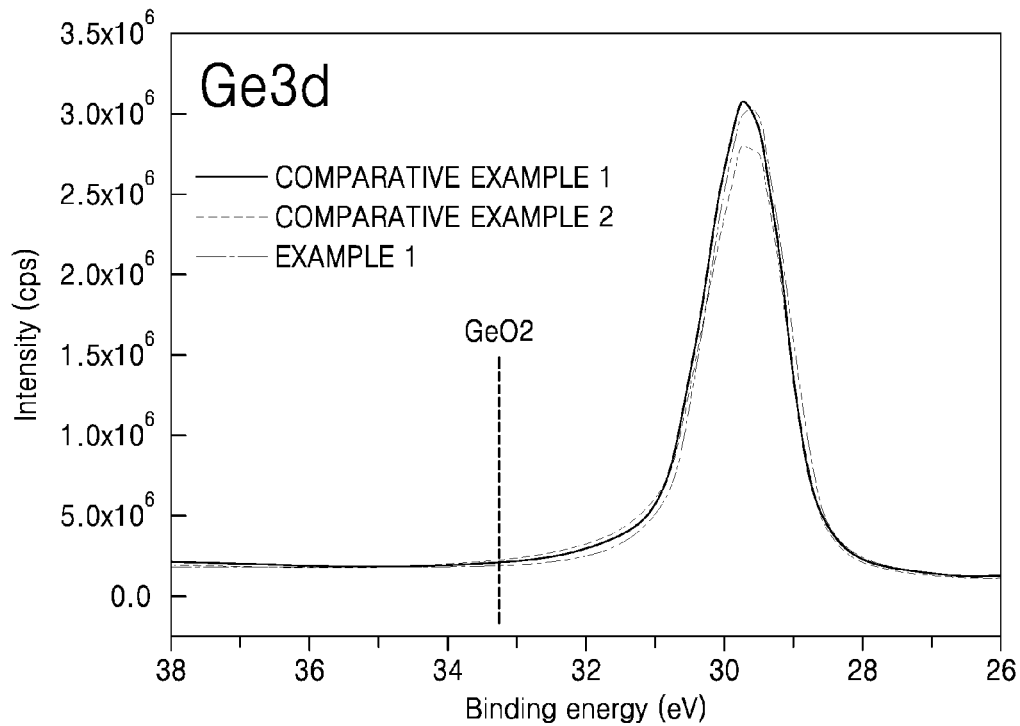

X-ray photoelectron spectroscopy (XPS) analyses were performed on thin films formed in Example 1, Comparative Example 1, and Comparative Example 2, and the analysis results are shown in FIGS. 4A and 4B.

Referring to FIG. 4A, peaks indicating binding energies (eV) of Comparative Example 1 and Comparative Example 2 are close to binding energies of $SiO_2$ and $Si_3N_4$, respectively, whereas a peak indicating binding energy of Example 1 is disposed between the peaks of Comparative Examples 1 and 2, which indicates that a SiON layer exists.

Referring to FIG. 4B, in the case of Example 1 and Comparative Example 1, germanium oxide was removed from the substrate by performing annealing of the substrate under a hydrogen atmosphere. As a result, a peak was not observed at a position of $GeO_2$, and a peak of $GeO_x$ was not observed at a lower energy side. In addition, the germanium oxide was mostly removed from the substrate by the annealing performed under an $NH_3$ atmosphere in Comparative Example 2.

Example 2

A $SiO_x$/SiON film was formed on a SiGe substrate including a native oxide film according to the method of forming the thin film. Then a high-k thin film was formed on the $SiO_x$/SiON film to manufacture a MOSCAP.

Comparative Example 3

A material of each layer in Comparative Example 3 may be substantially the same as the material of each layer in Example 2 whereas the thin film was formed using a chemical agent. Then, a MOSCAP was manufactured in the same manner as in Example 2.

Figure 4C:
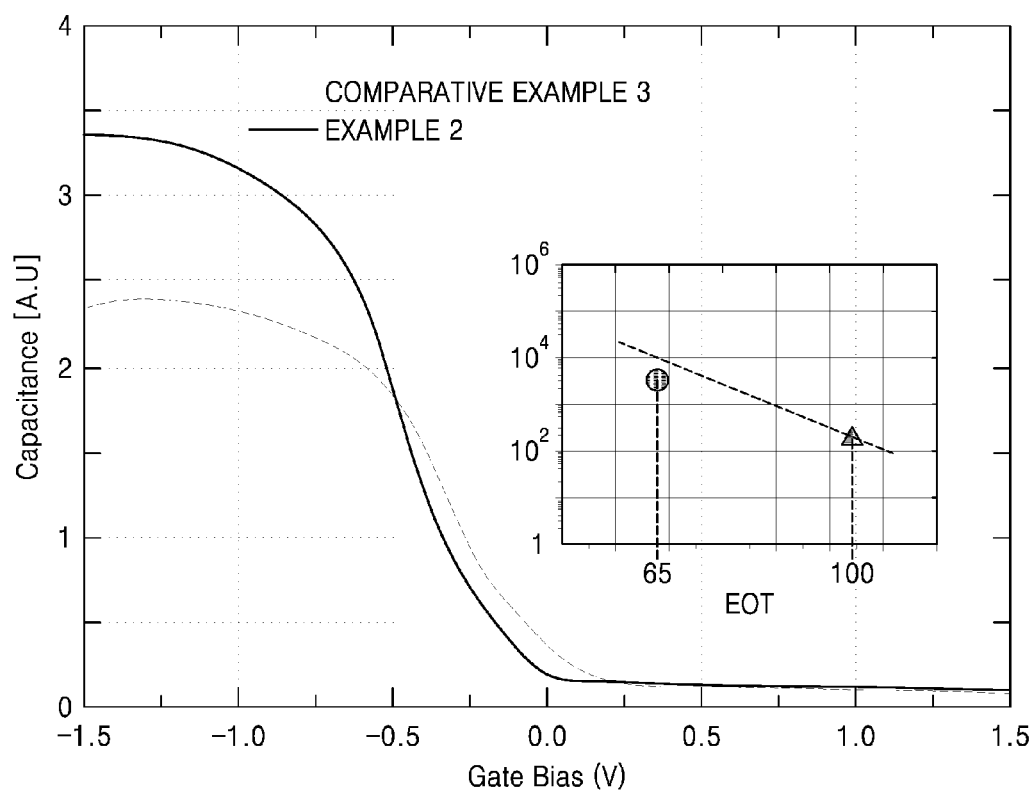
FIG. 4C is a graph showing results of electrical characteristics of a thin film measured by using MOSCAPs, according to some embodiments of the inventive concepts.

FIG. 4C is a graph showing results of electrical characteristics of a thin film measured by using MOSCAPs manufactured in Example 2 and Comparative Example 3.

Referring to FIG. 4C, it may be seen that the thin film of Example 2 is a thin film having a 35% smaller EOT compared to the thin film of Comparative Example 3.

Regarding Jg values according to EOT scaling, a Jg value (circular point) of Example 2 is located below a line indicating a general trend of Jg values extending from a Jg value triangular point) of Comparative Example 3 in spite of EOT scaling, such location of the Jg value (circular point) of Example 2 indicates that agate leakage due to EOT scaling is not caused.

Hereinafter, applications of the thin film 100 will be described in more detail.

The thin film 100 may be applied to various types of semiconductor devices, for example, a planar field effect transistor (FET), a FinFET, a gate-all-around (GAA) FET, and a vertical FET.

Figure 5A:
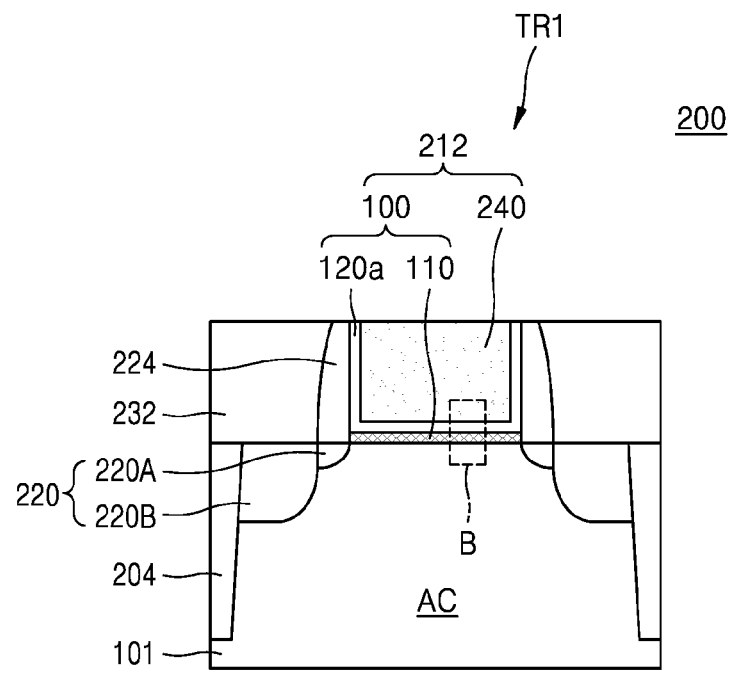
FIG. 5A is a cross-sectional view of a semiconductor device, according to some embodiments of the inventive concepts.
Figure 5B:
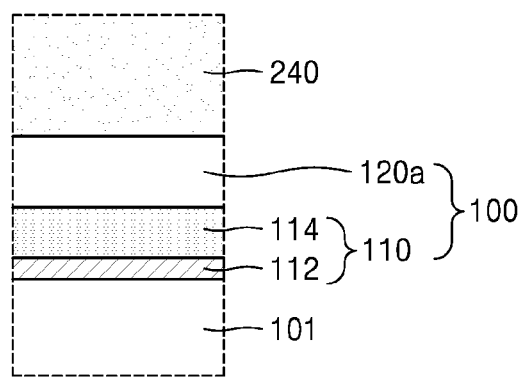
FIG. 5B is a partial enlarged view of a portion B of FIG. 5A.

FIG. 5A is across-sectional view of a semiconductor device 200 according to some embodiments of the inventive concepts, and FIG. 5B is a partial enlarged view of a portion B of FIG. 5A. The semiconductor device 200 may be a planar FET and may be a semiconductor device constituting a portion of an integrated circuit. In FIGS. 5A and 5B, like reference numerals as used in FIGS. 1 and 3A to 3D refer to like elements, and detailed descriptions thereof will be omitted herein.

Referring FIG. 5A, the semiconductor device 200 may include a device isolation film 204 defining an active region AC in a semiconductor substrate 101. The device isolation film 204 may include a silicon oxide film, a silicon nitride film, and a combination thereof. In addition, a transistor TR1 may be formed in the active region AC.

The transistor TR1 may have agate structure 212 including an interface layer stack 110, a gate dielectric film 120a, and a gate electrode 240, which are sequentially stacked on the active region AC. The interface layer stack 110 may be formed on the active region AC, and a configuration thereof will be described with reference to FIG. 5B.

Referring to FIG. 5B, the interface layer stack 110 may include a lower interface layer 112 and an upper interface layer 114. The lower interface layer 112 may contact the active region AC, and the upper interface layer 114 may be disposed on the lower interface layer 112. In addition, the gate dielectric film 120a and the gate electrode 240 may be sequentially formed on the interface layer stack 110.

The lower interface layer 112 may include, for example, silicon oxide, and the silicon may include silicon derived from the semiconductor substrate 101. The lower interface layer 112 may have a thickness of about 1 Å to about 5 Å.

The upper interface layer 114 may include, for example, silicon oxynitride, and the silicon may include silicon derived from the semiconductor substrate 101. The upper interface layer 114 may be thicker than the lower interface layer 112. For example, a thickness of the upper interface layer 114 may be about 3 times to about 10 times of a thickness of the lower interface layer 112. For example, the upper interface layer 114 may have a thickness of about 3 Å to about 25 Å. The interface layer stack 110 may have a total thickness of about 5 Å to about 30 Å.

Referring back to FIG. 5A, the gate dielectric film 120a may include a material having a dielectric constant greater than a dielectric constant of the interface layer stack 110. For example, the gate dielectric film 120a may include a material having a dielectric constant of about 10 to about 25. In some exemplary embodiments, the gate dielectric film 120a may include one selected from a group including hafnium oxide, hafnium oxynitride, hafnium silicon oxide, lanthanum oxide, lanthanum aluminium oxide, lanthanum silicon oxide, zirconium oxide, zirconium silicon oxide, tantalum oxide, tantalum hafnium oxide, tantalum aluminium oxide, tantalum silicon oxide, tantalum zirconium oxide, titanium oxide, titanium aluminium oxide, barium strontium titanium oxide, barium titanium oxide, strontium titanium oxide, yttrium oxide, erbium oxide, dysprosium oxide, gadolinium oxide, gallium oxide, aluminium oxide, aluminium silicon oxide, silicon germanium oxide, lead scandium tantalum oxide, lead zinc niobate, and any combinations thereof. For example, the gate dielectric film 120a may include at least one material selected from a group including $HfO_2$, $ZrO_2$, $HfSiO_x$, $TaSiO_x$, and $LaO_x$. However, in the semiconductor device 200 according to an exemplary embodiment of the inventive concept, a material of the gate dielectric film 120a is not limited to the selected material.

The gate electrode 240 may include a metal-containing layer configured to enable adjustment of a work function and a metal-containing layer configured to enable gap-filling, which fills a space formed in an upper portion of the metal-containing layer for adjusting the work function. In some embodiments, the gate electrode 240 may have a structure including a metal nitride layer, a metal layer, a conductive capping layer, and a gap-filling metal film, which are sequentially stacked. For example, each of the metal nitride layer and the metal layer may include at least one material selected from a group including Ti, W, Ru, Nb, Mo, Hf, Ni, Co, Pt, Yb, Tb, Dy, Er, and Pd. The conductive capping layer may function as a protection film preventing a surface of the metal layer from being oxidized. In addition, the conductive capping layer may be configured to be a wetting layer facilitating a deposition when other conductive layers are deposited on the metal layer. The conductive capping layer may include metal nitride, for example, TiN, TaN, or a combination thereof, but is not limited thereto. The gap-filling metal film may include a tungsten (W) film. The gap-filling metal film may fill a recess space defined in an upper surface of the conductive capping layer by stepped portions without voids.

The gate structure 212 may be formed through a gate-last process (referred to as a replacement poly-gate (RPG) process). However, the inventive concepts are not limited thereto.

Both sidewalk of the gate structure 212 may be covered with insulating spacers 224. The insulating spacers 224 may include one selected from a group including silicon nitride, silicon oxide, and a combination thereof.

The interface layer stack 110 may be restricted to being formed between the gate electrode 240 and the semiconductor substrate 101, such that the interface layer stack 110 is not be formed on both sidewalls of the gate electrode 240. The interface layer stack 110 may be restricted from being formed between the gate electrode 240 and the insulating spacers 224.

The gate dielectric film 120a may cover a lower surface and both sidewalls of the gate electrode 240. The gate dielectric film 120a may extend to be interposed between the gate electrode 240 and the active region AC and between the gate electrode 240 and the insulating spacers 224.

Source/drain regions 220 may be formed at both sides of the gate electrode 240 in the active region AC. The source/drain regions 220 may include a source/drain extension region 220A and a deep source/drain region 220B.

The source/drain regions 220 may be covered with an inter-gate insulating film 232. The inter-gate insulating film 232 may include a silicon oxide film but is not limited thereto.

The semiconductor device 200 may include a semiconductor device that is included in a peripheral circuit region functioning to input external data into a cell array region or output data from the cell array region.

Alternatively, the semiconductor device may be a semiconductor device that is included in a cell array region having unit memory cells arranged in a matrix form. The cell array region may be a logic cell region or a memory cell region. The logic region may include various logic cells that include a plurality of circuit elements, such as a transistor and a register, as standard cells performing a desired logical function, such as a counter or a buffer. The logic cell may include one or more of an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FILL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, or a latch. However, the cells are merely examples, and the logic cell constituting the integrated circuit device is not limited to cells described above. The memory cell region may be at least one cell region selected from a SRAM, a DRAM, an MRAM, an IMAM, and a PRAM.

Figure 6:
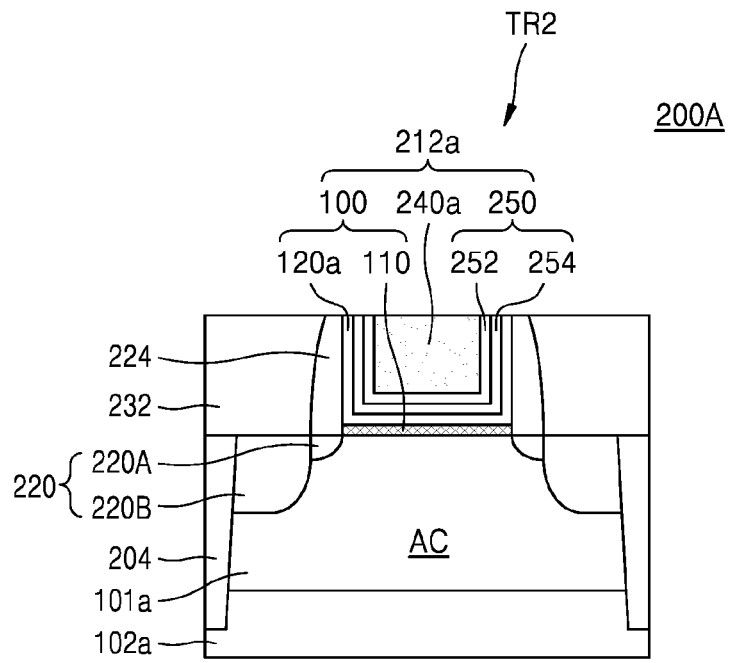
FIG. 6 is a cross-sectional view of a semiconductor device, according to some embodiments of the inventive concepts.

FIG. 6 is a cross-sectional view of a semiconductor device 200A according to some embodiments of the inventive concepts.

Referring to FIG. 6, the semiconductor device 200A according to the present exemplary embodiment is substantially the same as the semiconductor device 200 illustrated in FIG. 5A except for a gate structure 212A. Therefore, repeated descriptions of like elements will be omitted.

The semiconductor device 200A may include a device isolation film 204 at least partially defining an active region AC in semiconductor substrates (101a and 102a). A transistor TR2 may be formed in the active region AC.

The semiconductor substrate 102a may be substantially the same as the semiconductor substrate 101 described with respect to FIG. 1. The semiconductor substrate 101a may be, for example, a SiGe substrate.

The transistor TR2 may have a gate structure 212a including an interface layer stack 110, a gate dielectric film 120a, a functional film 250, and a gate electrode 240a, which are sequentially stacked on the active region AC. The functional film 250 may include a work function-adjusting film 254 and a barrier metal layer 252.

The work function-adjusting film 254 may be conformally formed along an inner surface of the gate dielectric film 120a. The barrier metal layer 252 may be conformally formed along an inner surface of the work function-adjusting film 254.

The work function-adjusting film 254 may be configured to adjust a work function of the gate electrode 240a. The barrier metal layer 252 may be configured to protect the work function-adjusting film 254 and may reduce or prevent a negative influence of the gate electrode 240a on the work function-adjusting film 254.

The work function-adjusting film 254 may include one or more of an N-type or P-type work function-adjusting film. In some embodiments, where the work function-adjusting film 254 includes an N-type work function-adjusting film, the work function-adjusting film 254 may include, for example, at least one material selected from a group including TiAl, TiAlN, TaC, TiC, and HfSi. However, the inventive concepts are not limited thereto. In some embodiments, where the work function-adjusting film 254 includes a P-type work function-adjusting film, the work function-adjusting film 254 may include, for example, at least one material selected from a group including Mo, Pd, Ru, Pt, TiN, WN, TaN, Ir, TaC, RuN, and MoN. However, the inventive concepts are not limited thereto. The barrier metal layer 252 may include, for example, TiN.

The gate electrode 240a may include, for example, at least one material selected from a group including Al, W, metal carbide, metal nitride, metal silicide, metal carbide, metal aluminium nitride, metal aluminium, and metal silicon nitride. More specifically, the gate electrode 240a may include, for example, one selected from a group including W, TaN, TiAlC, TaAlC, TaAl, TiAl, HfAl, Al, Ti, WN, Ru, Mo, and any combinations thereof. However, the inventive concepts are not limited thereto.

FIGS. 7A to 7E are cross-sectional views illustrating a method of manufacturing a semiconductor device 200A, according to some embodiments of the inventive concepts.

Figure 7A:
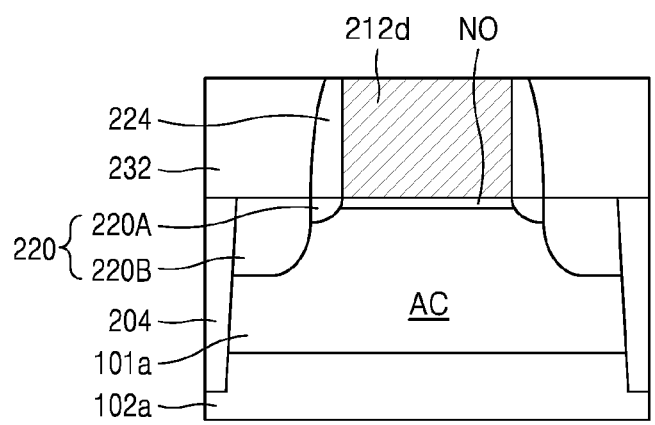
FIGS. 7A to 7E are cross-sectional views illustrating a method of manufacturing a semiconductor device, according to some embodiments of the inventive concepts.

Referring to FIG. 7A, an active region AC may be defined by forming a device isolation film 204 such as a shallow trench isolation (STI) region in semiconductor substrates 101a and 102a. A dummy gate electrode 212d may be formed on the active region AC.

Sidewalls of the dummy gate electrode 212d may be covered with insulating spacers 224. In addition, side surfaces of the dummy gate electrode 212d and the insulating spacers 224 may be covered with an inter-gate insulating film 232.

The dummy gate electrode 212d may include, for example, polysilicon, but is not limited thereto. Materials of the semiconductor substrates 101a and 102, the insulating spacers 224, and the inter-gate insulating film 232 have been described in detail with reference to FIGS. 5A and 6, and additional descriptions thereof will be omitted herein.

In FIG. 7A, a native oxide film NO is illustrated as being formed at a portion where the dummy gate electrode 212d contacts the substrate 101a, but the native oxide film NO is not necessarily limited thereto. For example, while the dummy gate electrode 212d is removed in a subsequent process, the native oxide film NO may be formed on an exposed portion of the substrate 101a.

A source/drain extension region 220A may be formed by implanting impurity ions using the dummy gate electrode 212d as an ion implantation mask. A deep source/drain region 220B may be formed by implanting impurity ions using the dummy gate electrode 212d and the insulating spacers 224 as an ion implantation mask. Depths of the source/drain extension and deep source/drain regions 220A and 220B may be controlled by adjusting ion implantation energy.

Figure 7B:
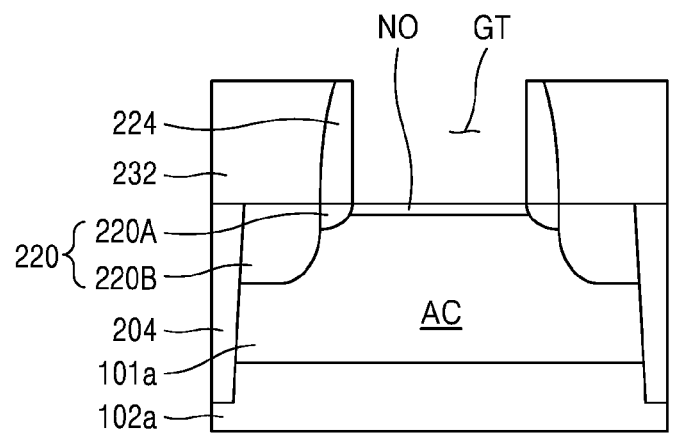

Referring to FIG. 7B, a gate trench GT may be formed by removing the dummy gate electrode 212d. A portion of an upper surface in the semiconductor substrate 101a may be exposed by the gate trench GT. In particular, The gate trench GT may expose a portion of the substrate 101a, in which the native oxide film is formed, or the native oxide film NO may be formed after the exposure.

In addition, the portion of the substrate 101a exposed by the gate trench GT may correspond to a channel region of a semiconductor device to be manufactured later.

Figure 7C:
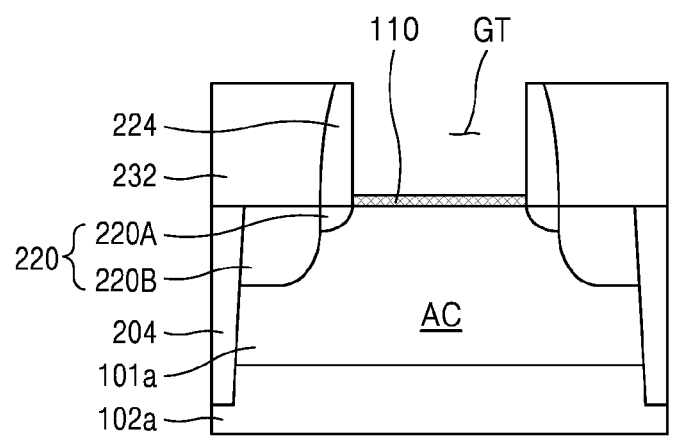

Referring to FIG. 7C, an interface layer stack 110 may be formed by performing one or more of a first surface treatment and a second surface treatment on the native oxide film NO. As described above, the interface layer stack 110 may include a lower interface layer 112 and an upper interface layer 114. In addition, since the first surface treatment and the second surface treatment have been described with reference to FIGS. 2 and 3A to 3D, detailed descriptions thereof will be omitted herein.

In FIG. 7C, although a lower surface of the interface layer stack 110 is illustrated as matching an upper surface of the native oxide film NO of FIG. 7B, this is only for convenience of illustration and the inventive concepts is not necessarily limited thereto. For example, the lower surface of the interface layer stack 110 may be lower than the upper surface of the native oxide film NO of FIG. 7B.

Figure 7D:
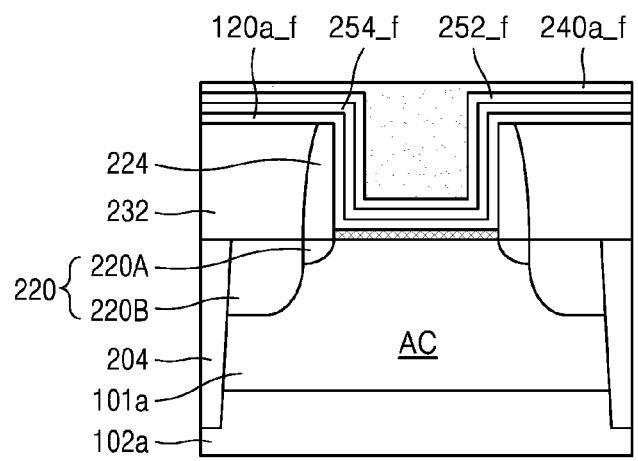

Referring to FIG. 7D, a gate dielectric material film 120a_f, a work function-adjusting material film 254_f, a barrier metal material film 252_f and a gate electrode material film 240_f may be sequentially formed on a lower surface and side surfaces of the gate trench GT and an upper surface of the inter-gate insulating film 232.

In particular, each of the gate dielectric material film 120a_f, the work function-adjusting material film 254_f, and the barrier metal material film 252_f may be conformally formed along each surface. In addition, the gate electrode material film 240a_f may be formed to fill a trench defined by the barrier metal material film 252_f.

Each of the gate dielectric material film 120a the work function-adjusting material film 254_f, the barrier metal material film 252_f and the gate electrode material film 240a_f may be independently formed through an atomic layer deposition (ALD) process, a chemical vapor deposition (CVD) process, or a physical vapor deposition (PVI)) process. However, the inventive concepts are not limited thereto.

Figure 7E:
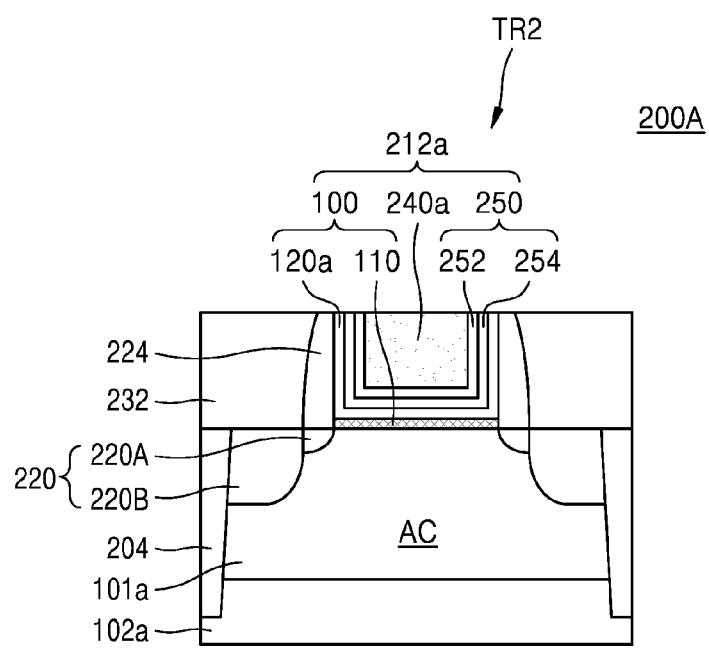

Referring to FIG. 7E, the final semiconductor device 202A may be manufactured by performing polishing until the upper surface of the inter-gate insulating film 232 is exposed. The polishing may be performed through chemical mechanical polishing (CMP).

A method of manufacturing the semiconductor device according to some embodiments of the inventive concepts may be used to manufacture a semiconductor device having a high operating speed, a low leakage current, and excellent electrical characteristics.

Figure 8A:
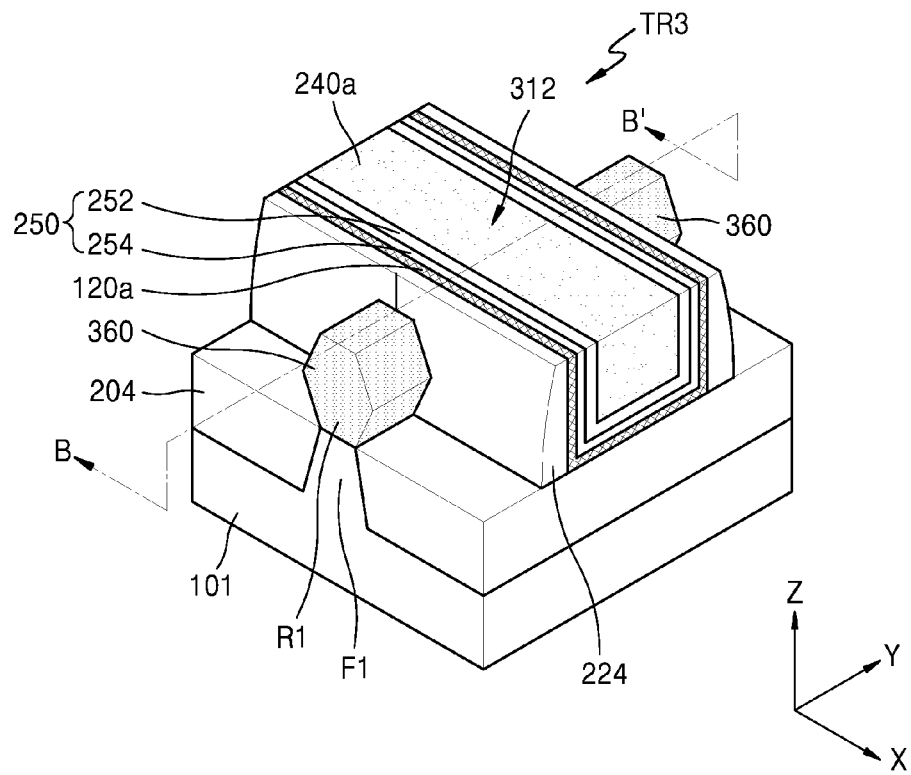
FIG. 8A is a perspective view of a semiconductor device according to some embodiments of the inventive concepts.
Figure 8B:
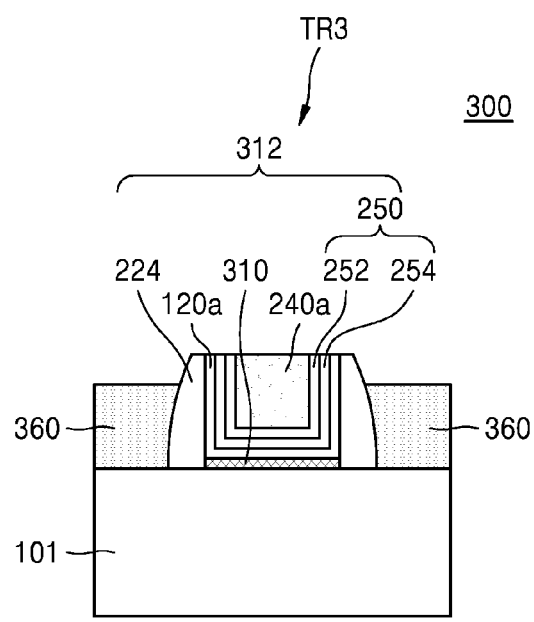
FIG. 8B is across-sectional view taken along line B-B' of the semiconductor device of FIG. 9A.

FIG. 8A is a perspective view of a semiconductor device 300 according to some embodiments of the inventive concepts. FIG. 8B is a cross-sectional view taken along B-B' of the semiconductor device of FIG. 8A.

An example of the semiconductor device 300 having a FinFET structure will be described with reference to FIGS. 8A and 8B. In FIGS. 8A and 8B, like reference numerals as used in FIGS. 1, 5A, and 6 refer to like elements, and detailed descriptions thereof will be omitted herein.

Referring to FIGS. 8A and 8B, the semiconductor device 300 may include a fin-shaped active region F1 protruding in a vertical direction (a Z-direction) from a main surface of a semiconductor substrate 101. The fin-shaped active region F1 may extend in a Y-direction. Since the material of the fin-shaped active region H has been described with reference to FIG. 1, additional descriptions thereof will be omitted herein.

A lower portion of the fin-shaped active region F1 may be partially covered with a device isolation film 204 formed on the semiconductor substrate 101. A transistor TR3 may be formed in the fin-shaped active region F1. A portion of an upper portion in the fin-shaped F1 may be provided as an active region of the transistor TR3.

The transistor TR3 may include a gate structure 312 that extends in a direction intersecting with the fin-shaped active region F1 to cover the upper surface and both sidewalls of the fin-shaped active region F1. The gate structure 312 may include an interface layer 310, a gate dielectric film 120a, a functional film 250, and a gate electrode 240a, which are sequentially stacked on the fin-shaped active region F1. The functional film 250 may include a work function-adjusting film 254 and a barrier metal layer 252.

The interface layer 310 may include a lower interface layer 112 and an upper interface layer 114 as described with reference to FIGS. 1 and 5B. The interface layer 310 may be formed only at a portion of the upper surface and sidewalls, which is covered with the gate structure 312. Therefore, the interface layer 310 may not be formed at a portion where the gate structure 312 contacts the device isolation film 204, which may be caused by the formation of the interface layer 310 using a naturally oxidized surface of the semiconductor substrate 101.

The gate structure 312 may be formed through a gate-last process. However, the inventive concepts are not limited thereto.

The transistor TR3 may include source/drain regions 360 formed at both sides of the gate structure 312 in the fin-shaped active region F1. In FIGS. 8A and 8B, the source/drain regions are illustrated as having a raised source/drain (RSD) structure, but the inventive concepts is not limited thereto. For example, the source/drain regions 360 may include impurity-doped regions formed in corresponding regions of the fin-shaped active region F1.

As illustrated in FIGS. 8A and 8B, in order to form the source/drain regions 360 having the RSD structure, after a recess is formed by removing a portion of the fin-shaped active region F1, a semiconductor layer for forming the source/drain regions 360 may be epitaxially grown from inside the recess R1. In some exemplary embodiments, the source/drain regions 360 may include at least one material selected from a group including Si, SiC, and SiGe, but the inventive concepts are not limited thereto. Upper surfaces of the source/drain regions 360 may be higher than the upper surface of the fin-shaped active region F1.

Both sidewalls of the gate structure 312 may be covered with insulating spacers 224. The insulating spacers 224 may include one selected from a group including silicon nitride, silicon oxynitride, and a combination thereof. The source/drain regions 360 may be spaced apart from the gate structure 312 located between the insulating spacers 224.

Figure 9A:
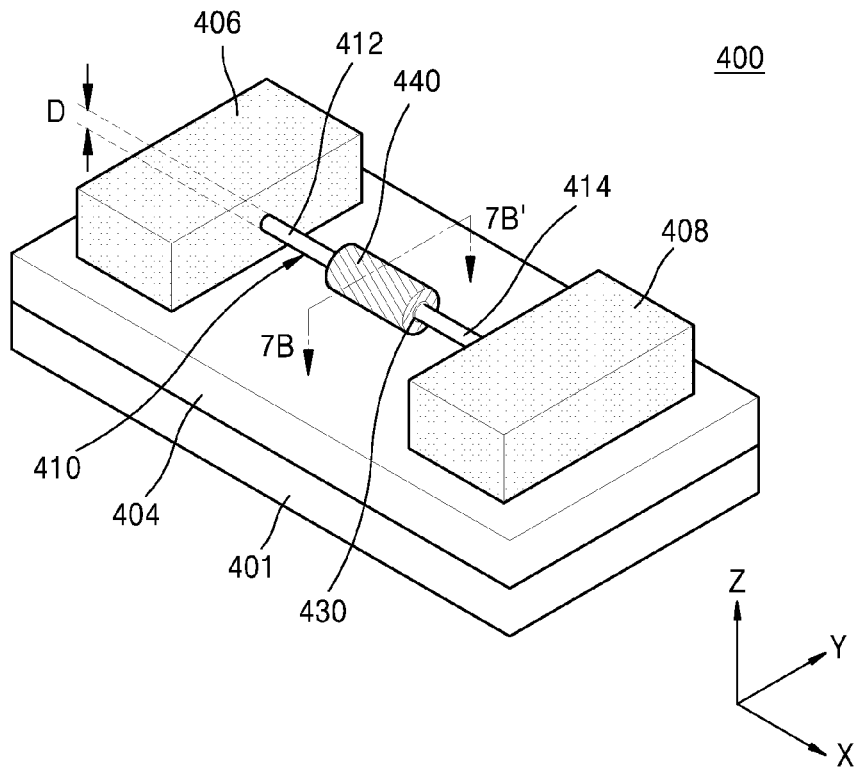
FIG. 9A is a perspective view of a semiconductor device according to some embodiments of the inventive concepts.
Figure 9B:
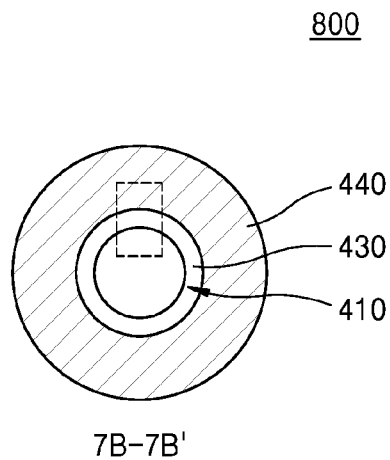
FIG. 9B is a cross-sectional view taken along line 7B-7B' of the semiconductor device of FIG. 9A.
Figure 9C:
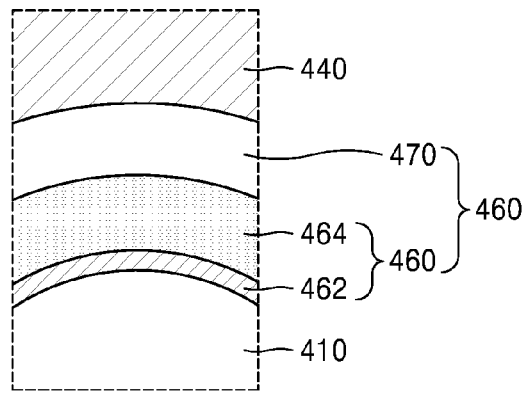
FIG. 9C is a partial enlarged view of a portion B of FIG. 9B.

FIG. 9A is a perspective view of a semiconductor device 400 according to some embodiments of the inventive concepts. FIG. 9B is a cross-sectional view taken along line 7B-7B' of the semiconductor device 400 of FIG. 9A. FIG. 9C is a partial enlarged view of a portion B of FIG. 9B. In FIGS. 9A to 9C, like reference numerals as used in FIGS. 1, 5A, 5B, 6, 8A, and 8B refer to like elements, and detailed descriptions thereof will be omitted herein.

Referring to FIGS. 9A and 9B, the semiconductor device 400 may include a first pad region 406 and a second pad region 408, which are disposed on an insulating film 404 on a base substrate 401.

The base substrate 401 may include a least one selected from a group including a semiconductor element such as Si or Ge and a compound semiconductor material including one or more of SiC, GaAs, InAs, or InP. The insulating film 404 may include an oxide.

The first pad region 406 may be connected to the second pad region 408 through a semiconductor body 410 having a nanowire shape. The semiconductor body 410 may extend between the first pad region 406 and the second pad region 408 in a first direction (that is, an X-direction) parallel to an extension direction of a main surface of the base substrate 401.

The first and second pad regions 406 and 408 and the semiconductor body 410 may be integrally formed. Materials of the first and second pad regions 406 and 408 and the semiconductor body 410 may be substantially the same as the semiconductor substrate 101 described with reference to FIG. 1.

In some exemplary embodiments, the semiconductor body 410 may have a diameter D of about 30 nm or less. For example, the semiconductor body 410 may have a diameter D of about 20 nm or less.

The semiconductor device 400 may include a dielectric layer structure 430 and a gate electrode 440. The dielectric layer structure 430 may surround the semiconductor body 410, and the gate electrode 440 may cover the dielectric layer structure 430 surrounding the semiconductor body 410.

In some exemplary embodiments, the dielectric layer structure 430 may include the thin film as described with reference to FIG. 1. Referring to FIG. 9C, the dielectric layer structure 430 may include an interface layer stack 460 and a gate dielectric film 470. The gate dielectric film 470 may be substantially the same as the gate dielectric film 120a described with reference to FIGS. 5A and 5B.

The interface layer stack 460 may include a lower interface layer 462 and an upper interface layer 464. The lower and upper interface layers 462 and 464 may be substantially the same as the lower and upper interface layers 112 and 114 described with reference to FIGS. 5A and 5B.

In the semiconductor body 410, impurity-doped source and drain regions 412 and 414 may be formed at both sides of the gate electrode 440.

In FIG. 9A, surfaces of the source and drain regions 412 and 414 are illustrated as being exposed, but all or part of the peripheral surfaces of the source and drain regions 412 and 414 exposed in FIG. 9A may be covered by the dielectric layer structure 430.

In FIGS. 9A and 9B, the semiconductor body 410 is illustrated as having a circular cross-section, but the cross-section of the semiconductor body 410 may be an oval, a square, or a rectangle, and is not particularly limited. In FIG. 9A, only one semiconductor body 410 is illustrated, but a plurality of semiconductor bodies 410 may be repeatedly disposed in a Y-direction or a Z-direction.

Figure 10:
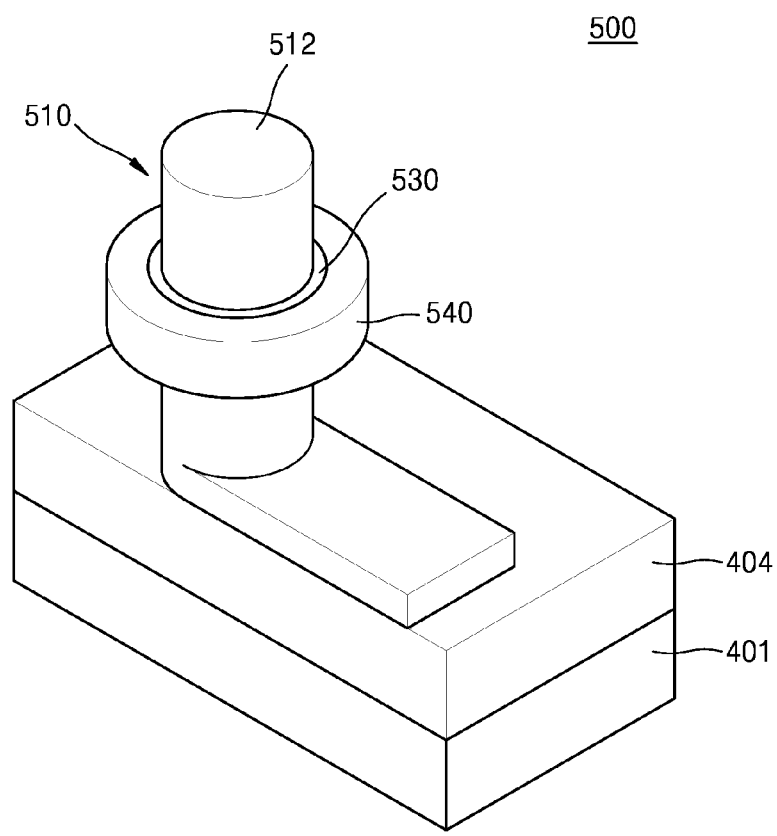
FIG. 10 is a perspective view of a semiconductor device according to some embodiments of the inventive concepts.

FIG. 10 is a cross-sectional view of a semiconductor device 500 according to some embodiments of the inventive concepts. In FIG. 10, like reference numerals as used in FIGS. 1, 5A, 5B, 6, and 8A to 9B refer to like elements, and detailed descriptions thereof will be omitted herein.

Referring to FIG. 10, the semiconductor device 500 may include a semiconductor layer 510 disposed on an insulating film 404 on a base substrate 401. The semiconductor layer 510 may include a semiconductor body 512 extending in a direction perpendicular to a main surface of the base substrate 401. The semiconductor device 500 may include a dielectric layer structure 530 and a gate electrode 540. The dielectric layer structure 530 may surround the semiconductor body 512, and the gate electrode 540 may cover the dielectric layer structure 530 surrounding the semiconductor body 512.

In some embodiments, the dielectric layer structure 530 may include the interface layer stack 110 and the insulating layer 120 described with reference to FIG. 1 or may include the interface layer stack 110 and the gate dielectric film 120a described with reference to FIGS. 5A and 5B.

The gate electrode 540 may include the material of the gate electrode 240 described with reference to FIG. 5A.

In the semiconductor body 512, impurity-doped source and drain regions may be formed at different ends of the gate electrode 540.

In the semiconductor devices 200, 200A, 300, 400, and 500 illustrated in FIGS. 5A, 6, 8A, 9A, and 10, the interface layer may be formed by a method according to some embodiments of the inventive concepts to manufacture a semiconductor device having a high operating speed, a low leakage current, and excellent electrical characteristics.

Figure 11:
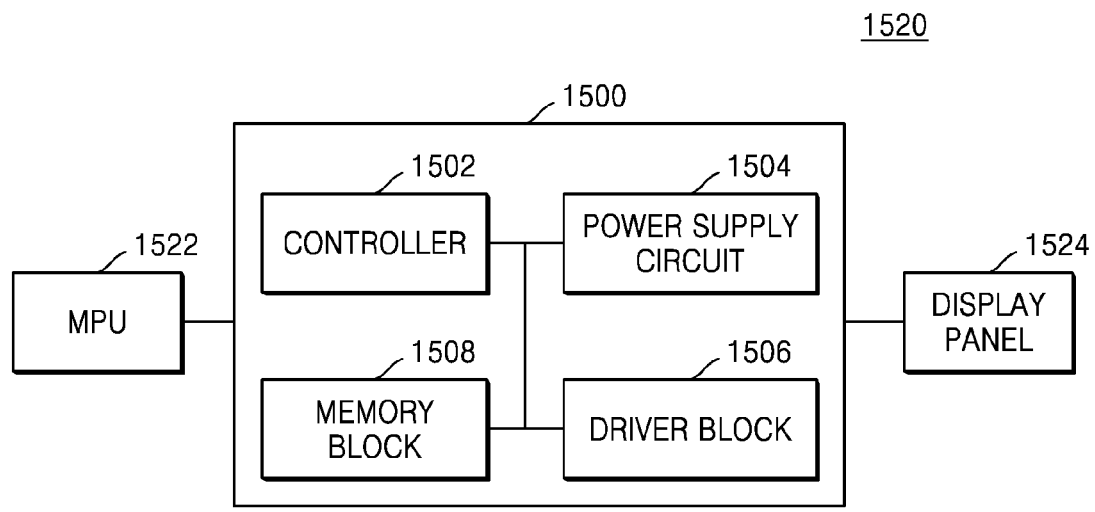
FIG. 11 is a block diagram of a display driver IC (DDI) and a display device including the DDI, according to some embodiments of the inventive concepts.

FIG. 11 is a block diagram of a display driver IC (DUI) 1500 and a display device 1520 including the DDI 1500, according to some embodiments of the inventive concepts;

Referring to FIG. 11, the DDI 1500 may include a controller 1502, a power supply circuit 1504, a driver block 1506, and a memory block 1508. The controller 1502 may receive a command from a main processing unit (MPU) 1522, may decode the received command, and may control the driver block 1506 and the memory block 1508 of the DDI 1000 to implement an operation according to the received command. The power supply circuit 1504 may generate a driving voltage in respond to the control of the controller 1502. The driver block 1506 may drive a display panel 1524 by using the driving voltage generated by the power supply circuit 1504 in response to the control by the controller 1502. The display panel 1524 may be a liquid crystal display panel, a plasma display panel, or an organic light emitting diode (OLED) display panel. The memory block 1508 may be a block that temporarily stores a command inputted to the controller 1502 or control signals outputted from the controller 1502 or stores pieces of necessary data. The memory block 1508 may include a memory such as a RAM or a ROM. At least one of the power supply circuit 1504 and the driver block 1506 may include at least one of the semiconductor devices 200, 200a, 300, 400, and 500 described with reference to FIGS. 5A to 10, and modifications of the semiconductor devices 200, 200a, 300, 400, and 500.

Figure 12:
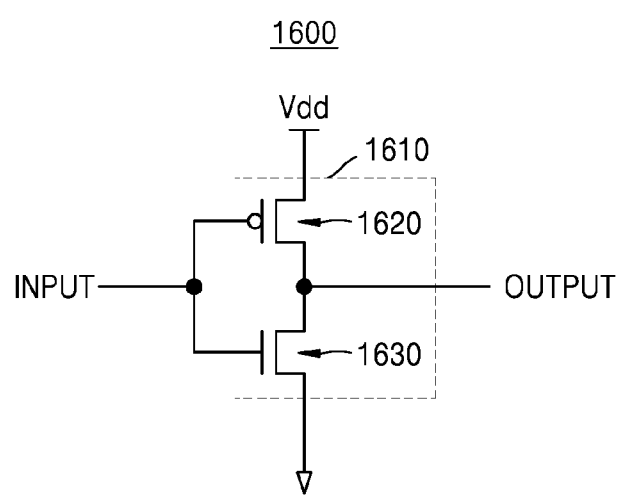
FIG. 12 is a circuit diagram of a CMOS inverter according to some embodiments of the inventive concepts.

FIG. 12 is a circuit diagram of a CMOS inverter 1600 according to some embodiments of the inventive concepts.

The CMOS inverter 1600 may include a CMOS transistor 1610. The CMOS transistor 1610 may include a PMOS transistor 1620 and an NMOS transistor 1630, which are connected to each other between a power terminal Vdd and a ground terminal. The CMOS transistor 1610 may include at least one of the semiconductor devices 200, 200a, 300, 400, and 500 described with reference to FIGS. 5A to 10, and modifications of the semiconductor devices 200, 200a, 300, 400, and 500.

Figure 13:
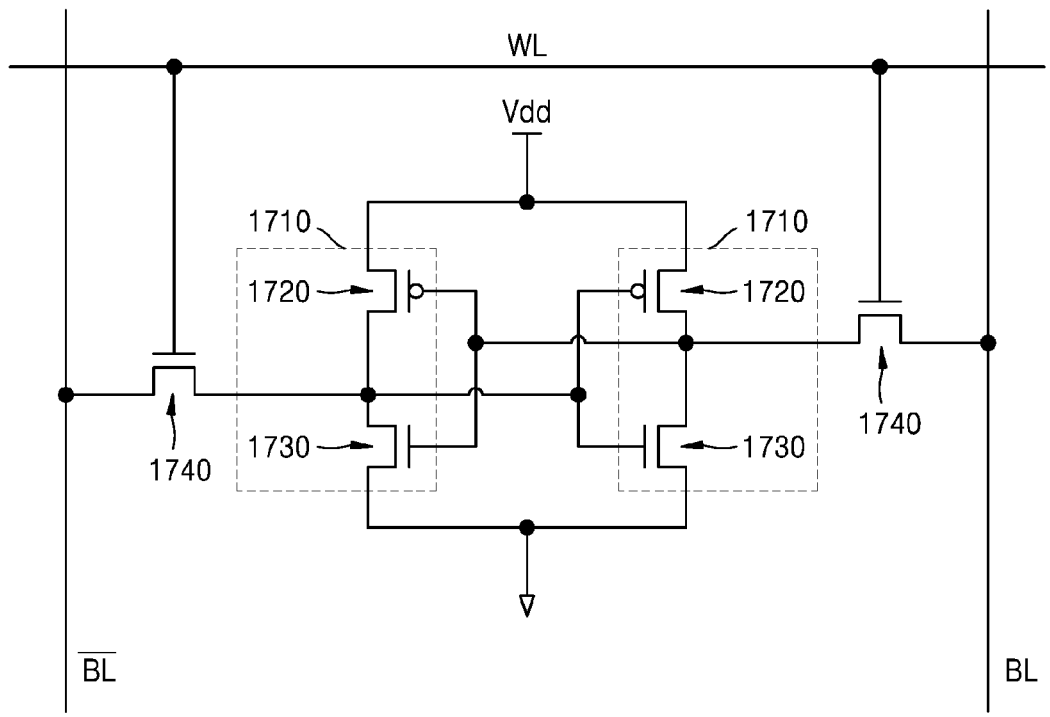
FIG. 13 is a circuit diagram of a CMOS SRM device according to some embodiments of the inventive concepts.

FIG. 13 is a circuit diagram of a CMOS SRM device 1700 according to some embodiments of the inventive concepts.

The CMOS SRAM device 1700 may include a pair of driving transistors 1710. Each of the pair of driving transistors 1710 may include a PMOS transistor 1720 and an NMOS transistor 1730, which are connected to each other between a power terminal Vdd and a ground terminal. The CMOS SRAM device 1700 may further include a pair of transfer transistors 1740. A source of the transfer transistor 1740 is cross-connected to a common node of the PMOS transistor 1720 and the NMOS transistor 1730 constituting the driving transistor 1710. The power terminal Vdd is connected to a source of the PMOS transistor 1720, and the ground terminal is connected to a source of the NMOS transistor 1730. A word line WL is connected to gates of the pair of transfer transistors 1740, and a bit line BL and an inversed bit line BL' are connected to drains of the pair of transfer transistors 1740, respectively.

At least one of the driving transistors 1710 and the transfer transistors 1740 may include at least one of the semiconductor devices 200, 200a, 300, 400, and 500 described with reference to FIGS. 5A to 10, and modifications of the semiconductor devices 200, 200a, 300, 400, and 500.

Figure 14:
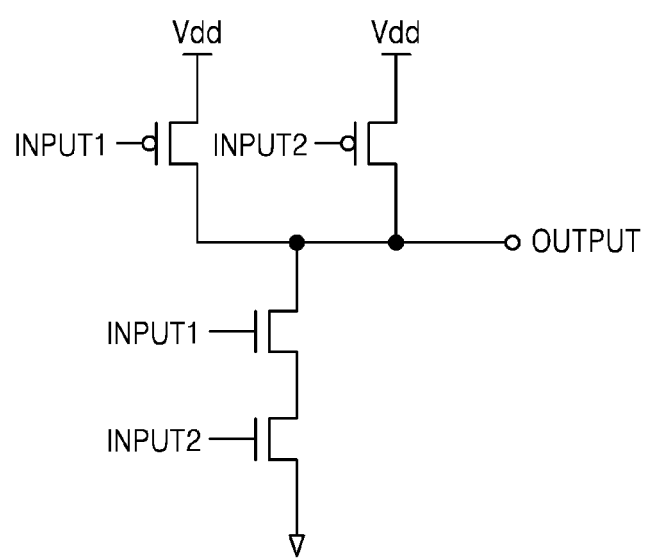
FIG. 14 is a circuit diagram of a CMOS NAND circuit according to some embodiments of the inventive concepts.

FIG. 14 is a circuit diagram of a CMOS NAND circuit 1800 according to some embodiments of the inventive concepts.

The CMOS NAND circuit 1800 may include a pair of CMOS transistors receiving different input signals. The CMOS NAND circuit 1800 may include at least one of the semiconductor devices 200, 200a, 300, 400, and 500 described with reference to FIGS. 5A to 10, and modifications of the semiconductor devices 200, 200a, 300, 400, and 500.

Figure 15:
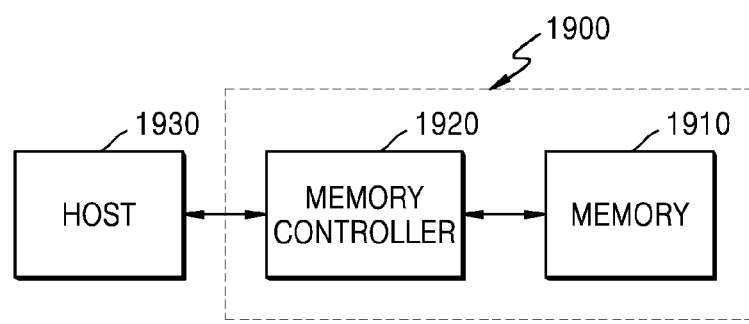
FIG. 15 is a block diagram of an electronic system according to some embodiments of the inventive concepts.

FIG. 15 is a block diagram of an electronic system 1900 according to some embodiments of the inventive concepts.

The electronic system 1900 may include a memory 1910 and a memory controller 1920. The memory controller 1920 may control the memory 1910 in response to a request from a host 1930 so as to read out data from the memory 1910 and/or write data in the memory 1910. At least one of the memory 1910 and the memory controller 1920 may include at least one of the semiconductor devices 200, 200a, 300, 4000, and 500 described with reference to FIGS. 5A to 10, according to some exemplary embodiments of the inventive concepts and semiconductor devices changed or modified within the scope of the scope of the inventive concept.

Figure 16:
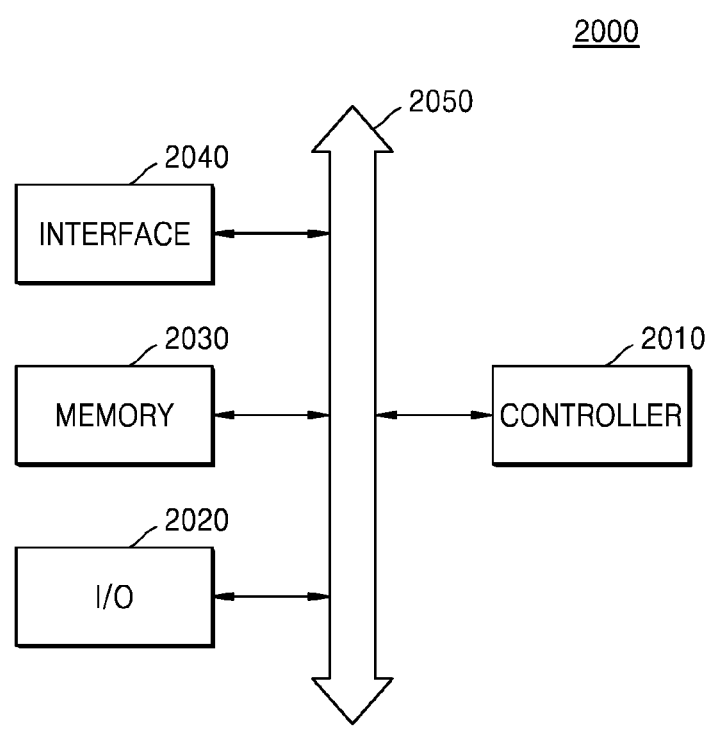
FIG. 16 is a block diagram of an electronic system according to some embodiments of the inventive concepts.

FIG. 16 is a block diagram of an electronic system 2000 according to some embodiments of the inventive concepts.

The electronic system 2000 may include a controller 2010, an input/output (I/O) unit 2020, a memory 2030, and an interface 2040, which are connected to one another through a bus 2050.

The controller 2010 may include at least one of a microprocessor, a digital signal processor, and other similar processing devices. The I/O unit 2020 may include at least one of a keypad, a keyboard, and a display. The memory 2030 may be used to store a command executed by the controller 2010. For example, the memory 2030 may be used to store user data.

The electronic system 2000 may constitute a wireless communication device or a device capable of transmitting and/or receiving information in a wireless environment. The interface 2040 may include a wireless interface for transmitting/receiving, data through a wireless communication network in the electronic system 2000. The interface 2040 may include an antenna and/or a wireless transceiver. In some exemplary embodiments, the electronic system 2000 may be used in a communication interface protocol of a third generation communication system such as a code division multiple access (CDMA), a global system for mobile communications (GSM), a north American digital cellular (NADC), an extended-time division multiple access UE-TDMA), and/or a wide band code division multiple access (WCDMA). The electronic system 2000 may include at least one of the semiconductor devices 200, 200a, 300, 400, and 500 described with reference to FIGS. 5A to 10, according to some exemplary embodiments of the inventive concepts and semiconductor devices changed or modified within the scope of the scope of the inventive concept.

The foregoing description has been provided for purposes of illustration and description. It is not intended to be exhaustive or to limit the disclosure. Individual elements or features of a particular example embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of forming a thin film, the method comprising:
    preparing a semiconductor substrate;
    forming an interface layer stack on a surface of the semiconductor substrate, the interface layer stack including a first interface layer and an second interface layer, the forming including,
        performing a first surface treatment on the semiconductor substrate in a reducing atmosphere to form the first interface layer, the reducing atmosphere including a reducing gas, and
        performing a second surface treatment on the semiconductor substrate in a nitridation atmosphere that is different from the reducing atmosphere to form the second interface layer; and
    forming an insulating layer on the interface layer stack.

2. The method of claim 1, wherein,
    the semiconductor substrate includes a silicon germanium (SiGe) substrate, and
    prior to the first surface treatment, a native oxide film is formed on the surface of the semiconductor substrate.

3. The method of claim 2, wherein the first surface treatment includes selectively reducing at least a portion of germanium (Ge) oxide in the semiconductor substrate.

4. The method of claim 3, wherein the performing the first surface treatment includes performing the first surface treatment such that an amount of germanium (Ge) oxide in the semiconductor substrate being reduced, relative to an amount of germanium (Ge) oxide in the native oxide film.

5. The method of claim 1, wherein the performing the first surface treatment includes forming a silicon (Si) oxide film on the surface of the semiconductor substrate.

6. The method of claim 5, wherein the performing the second surface treatment includes forming a silicon oxynitride (SiON) film on the silicon oxide film.

7. The method of claim 6, wherein the interface layer stack includes both the silicon oxide film and the silicon oxynitride film.

8. A method of manufacturing a semiconductor device, the method comprising:
   preparing a semiconductor substrate;
   forming an interface layer stack on the semiconductor substrate, the forming including,
      performing a first surface treatment on a portion of the semiconductor substrate in a reducing atmosphere, the reducing atmosphere including a reducing gas, and
      performing a second surface treatment on the semiconductor substrate in a nitridation atmosphere that is different from the reducing atmosphere;
   forming a gate dielectric film on the interface layer stack; and
   forming a gate electrode on the gate dielectric film.

9. The method of claim 8, wherein a portion of the semiconductor substrate on which the first surface treatment is performed includes a channel region.

10. The method of claim 8, wherein a dielectric constant of the gate dielectric film is greater than a dielectric constant of the interface layer stack.

11. The method of claim 8, wherein the semiconductor substrate includes,
    at least one group III-V material, and
    at least one group IV material.

12. The method of claim 11, wherein,
    prior to the performing the first surface treatment, a native oxide film is located on a surface of the semiconductor substrate, the native oxide film including at least two elements, and
    the first surface treatment includes selectively reducing an oxide of a particular element of the at least two elements, the particular element being associated with a relatively larger atomic radius relative to a remainder of elements of the at least two elements.

13. The method of claim 12, wherein the performing the first surface treatment includes reducing an amount of the oxide of the particular element in the semiconductor substrate to an amount which is less than an amount of the oxide of the particular element in the native oxide film.

14. The method of claim 8, wherein,
    the performing the first surface treatment includes forming a lower interface layer on the semiconductor substrate,
    the performing the second surface treatment includes forming an upper interface layer on the semiconductor substrate, and
    the interface layer stack includes the lower interface layer and the upper interface layer.

* * * * *